United States Patent
Gong et al.

(10) Patent No.: US 10,784,313 B1
(45) Date of Patent: Sep. 22, 2020

(54) INTEGRATED RESISTIVE PROCESSING UNIT TO AVOID ABRUPT SET OF RRAM AND ABRUPT RESET OF PCM

(71) Applicant: INTERNATIONAL BUSINESS MACHINES CORPORATION, Armonk, NY (US)

(72) Inventors: Nanbo Gong, White Plains, NY (US); Takashi Ando, Tuckahoe, NY (US); Guy M. Cohen, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/436,999

(22) Filed: Jun. 11, 2019

(51) Int. Cl.
| | |
|---|---|
| *G11C 11/00* | (2006.01) |
| *H01L 27/24* | (2006.01) |
| *G11C 13/00* | (2006.01) |
| *H01L 45/00* | (2006.01) |
| *G11C 11/54* | (2006.01) |
| *G06N 3/04* | (2006.01) |

(52) U.S. Cl.
CPC ........... *H01L 27/2463* (2013.01); *G06N 3/04* (2013.01); *G11C 11/54* (2013.01); *G11C 13/0004* (2013.01); *G11C 13/0007* (2013.01); *G11C 13/0069* (2013.01); *G11C 13/0097* (2013.01); *H01L 27/2436* (2013.01); *H01L 45/06* (2013.01); *H01L 45/08* (2013.01); *H01L 45/1233* (2013.01); *H01L 45/1253* (2013.01); *H01L 45/1608* (2013.01); *G11C 2013/0092* (2013.01); *G11C 2213/79* (2013.01); *H01L 45/144* (2013.01)

(58) Field of Classification Search
CPC ..... H01L 27/2463; H01L 45/08; H01L 45/06; H01L 45/1608; H01L 45/1253; H01L 45/1233; H01L 27/2436; H01L 45/144; G11C 13/0097; G11C 13/0004; G11C 11/54; G11C 13/0007; G11C 13/0069; G11C 2213/79; G11C 2013/0092; G06N 3/04
USPC ........................................................ 365/148
See application file for complete search history.

(56) References Cited

U.S. PATENT DOCUMENTS

| | | |
|---|---|---|
| 8,854,859 B2 | 10/2014 | Chung |
| 8,982,615 B2 | 3/2015 | Conte et al. |
| 9,336,870 B1 * | 5/2016 | Mickel ................. G11C 13/0011 |

(Continued)

OTHER PUBLICATIONS

Chang et al., "Physical Mechanism of HfO2-based Bipolar Resistive Random Access Memory", Proceedings of 2011 International Symposium on VLSI Technology, Systems and Applications. IEEE. Apr. 25, 2011. pp. 1-2.

(Continued)

*Primary Examiner* — Thao-O H Bui
(74) *Attorney, Agent, or Firm* — Tutunjian & Bitetto, P.C.; Vazken Alexanian

(57) ABSTRACT

A method is presented for forming a cell structure. The method includes constructing a resistive random access memory (RRAM) device, constructing a phase change memory (PCM) device in series with the RRAM device such that one of the electrodes of the PCM device is connected to a reactive electrode of the RRAM device, and connecting a complementary metal oxide semiconductor (CMOS) inverter to the RRAM and PCM devices to individually control switching behaviors of the RRAM and PCM devices.

20 Claims, 8 Drawing Sheets

(56) References Cited

U.S. PATENT DOCUMENTS

| | | | |
|---|---|---|---|
| 9,583,171 B2 | 2/2017 | Kim et al. | |
| 10,482,953 B1* | 11/2019 | Lin | G11C 11/2259 |
| 2011/0084248 A1* | 4/2011 | Hsieh | H01L 45/147 |
| | | | 257/4 |
| 2011/0110171 A1 | 5/2011 | Kamp et al. | |
| 2012/0069627 A1* | 3/2012 | Minemura | G11C 13/0004 |
| | | | 365/148 |
| 2016/0267378 A1 | 9/2016 | Eleftheriou et al. | |
| 2016/0336064 A1 | 11/2016 | Seo et al. | |
| 2016/0379110 A1 | 12/2016 | Eleftheriou et al. | |

OTHER PUBLICATIONS

Gokmen, et al. "Acceleration of Deep Neural Network Training with resistive Cross-Point Devices: Design Considerations", Frontiers in Neuroscience. vol. 10. Article 333. Jul. 21, 2016. pp. 1-13.

Gong, et al. "Signal and noise extraction from analog memory elements for neuromorphic computing", Nature Communications. vol. 9. No. 1. May 29, 2018. pp. 1-8.

Pan et al., "1Kbit FINET Dielectric (FIND) RRAM in Pure 16nm FinFET CMOS Logic Process", 2015 IEEE International Electron Devices Meeting (IEDM). Dec. 7, 2015. pp. 1-4.

* cited by examiner

INTEGRATED RESISTIVE PROCESSING UNIT TO AVOID ABRUPT SET OF RRAM AND ABRUPT RESET OF PCM

BACKGROUND

The present invention relates generally to neuromorphic computing, and more specifically, to a complementary metal oxide semiconductor (CMOS) inverter employed with a resistive random access memory (RRAM) device and a phase change memory (PCM) device in a cell structure to avoid abrupt SET of the RRAM device and abrupt RESET of the PCM device.

Memories have been widely used in various electronic products. Due to the increasing need of data storage, the demands of capacities and performances of the memories become higher and higher. Among various memory elements, resistive random access memories (ReRAMs) have a high read/write speed and high miniaturization of element size and, thus, can replace conventional flash memories and dynamic random access memories (DRAMs) as the main stream of memory elements of the next generation.

Moreover, a phase-change memory (PCM) is one of next-generation nonvolatile memory devices that are expected to meet an increasing demand for a high-performance and low-power semiconductor memory device. In PCM devices, data can be stored by switching back and forth the material in the device between a crystalline phase and an amorphous phase.

SUMMARY

In accordance with an embodiment, a method is provided for forming a cell structure. The method includes constructing a resistive random access memory (RRAM) device, constructing a phase change memory (PCM) device in series with the RRAM device such that one of the electrodes of the PCM device is connected to a reactive electrode of the RRAM device, and connecting a complementary metal oxide semiconductor (CMOS) inverter to the RRAM and PCM devices to individually control switching behaviors of the RRAM and PCM devices.

In accordance with another embodiment, a cell structure for improving linearity of analog memory elements for neuromorphic computing is provided. The cell structure includes a resistive random access memory (RRAM) device, a phase change memory (PCM) device connected in series with the RRAM device such that one of the electrodes of the PCM device is connected to a reactive electrode of the RRAM device, and a complementary metal oxide semiconductor (CMOS) inverter connected to the RRAM and PCM devices to individually control switching behaviors of the RRAM and PCM devices.

In accordance with yet another embodiment, a crossbar array including a plurality of crossbar elements for improving linearity for neuromorphic computing is provided. The crossbar array includes a plurality of bitlines and wordlines, and the plurality of crossbar elements, each crossbar element disposed between a bitline and a wordline, wherein each crossbar element includes a resistive random access memory (RRAM) device, a phase change memory (PCM) device connected in series with the RRAM device such that one of the electrodes of the PCM device is connected to a reactive electrode of the RRAM device, and a complementary metal oxide semiconductor (CMOS) inverter connected to the RRAM and PCM devices to individually control switching behaviors of the RRAM and PCM devices.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
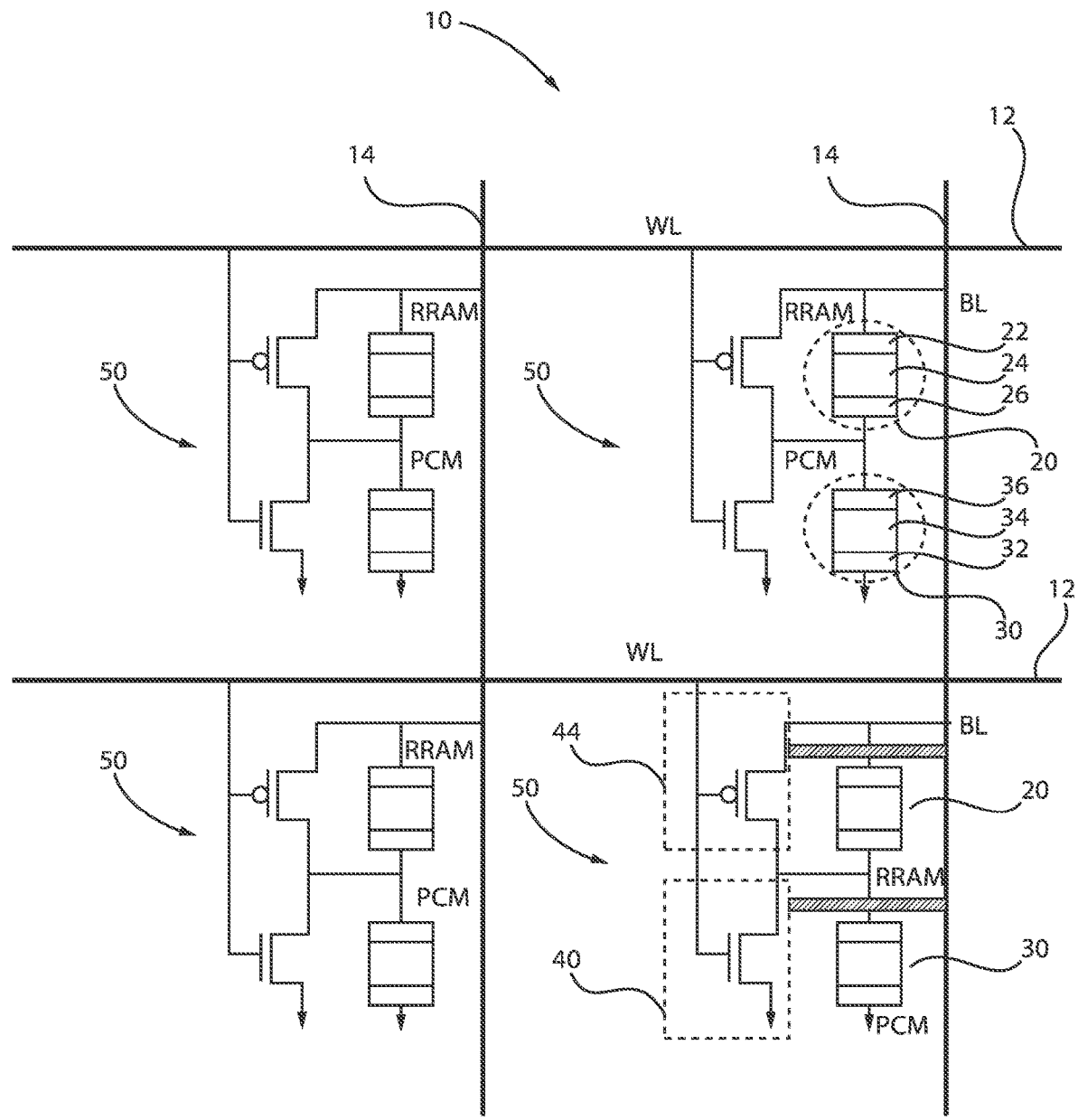
FIG. 1 is a perspective view of a complementary metal oxide semiconductor (CMOS) structure incorporating a phase change memory (PCM) and a resistive random access memory (RRAM) in a crossbar array format, in accordance with an embodiment of the present invention.

Embodiments in accordance with the present invention provide for a cell structure employed in crossbar arrays, the cell structure including a resistive random access memory (RRAM), a phase change memory (PCM) connected in series to the RRAM, and a complementary metal oxide semiconductor (CMOS) inverter connected to the RRAM and PCM. The PCM can be employed for SET operations and the RRAM can be employed for RESET operations. The n-type metal oxide semiconductor (NMOS) circuit of the CMOS inverter selects the PCM for SET operations and the p-type metal oxide semiconductor (PMOS) circuit of the CMOS inverter selects the RRAM for the RESET operations.

With the explosive growth of digital data in the era of Internet of Things (IoT), fast and scalable technologies including resistive switching memories are being explored for data storage and data-driven computation. A resistive switching memory (RRAM or ReRAM) offers high speed, high density, and low cost of fabrication as a result of its two-terminal structure. RRAM devices offer advantages in terms of area occupation, speed, and scaling. A common denominator for RRAM devices is that they are resistive memories where the resistance serves as a probed state variable. The resistance can be changed by electrical pulses according to various physical processes. For example, in a RRAM device, the resistance usually changes according to a state of a conductive filament within an insulating oxide layer. Moreover, the two-terminal structure of RRAM devices can be accommodated in a crosspoint or crossbar array where dense packing of wordlines and bitlines allows for an extremely small bit area. Another advantage of RRAM devices is the ability to independently program and erase each device, as well as the ability to accomplish faster switching, usually in a range of 100 nanoseconds (ns). The short switching time, combined with relatively low-voltage operation also allows for low program and erase energy use for low-power consumption.

RRAM is considered a promising technology for electronic synapse devices or memristor devices for neuromorphic computing, as well as high-density and high-speed non-volatile memory applications. In neuromorphic computing applications, a resistive memory device can be used as a connection (synapse) between a pre-neuron and a post-neuron, representing connection weight in the form of device resistance. Multiple pre-neurons and post-neurons can be connected through a crossbar or crosspoint array of RRAMs, which naturally expresses a fully-connected neural network. Resistive memories are promising not only for nonvolatile memories, but also for computing memories, thus allowing for fast data access and for computing architectures blurring a distinction between memory and computing circuits, such as nonvolatile memristive logic computation or neuromorphic networks.

Given this strong potential, large scale RRAM devices are presented in a crossbar architecture. RRAM has also been demonstrated with a relatively small scale, aimed at embedded memory applications in the automotive industry, smart cards, and smart sensors for Internet of Things (IoT) markets. Crossbar RRAM offers a higher density compared to dynamic random access memory (DRAM) and a higher speed compared to flash memory, in addition to nonvolatile behavior and 3D integration.

Phase change memory, on the other hand, is an emerging technology that combines the unique properties of phase change materials with the potential for novel memory devices, which can help lead to new computer architectures. Phase change materials store information in their amorphous and crystalline phases, which can be reversibly switched by the application of an external voltage. Phase change materials exist in an amorphous and one or sometimes several crystalline phases, and they can be rapidly and repeatedly switched between these phases. The switching is induced by heating through optical pulses or electrical (Joule) heating. The optical and electronic properties can vary significantly between the amorphous and crystalline phases, and this combination of optical and electrical contrast and repeated switching allows for data storage.

The exemplary embodiments of the present invention employ both RRAM and PCM in a cell structure in combination or in tandem with a CMOS inverter. The n-type metal oxide semiconductor (NMOS) circuit and the p-type metal oxide semiconductor (PMOS) circuit of the CMOS inverter allow for selective control of the RRAM device and PCM device during SET and RESET operations or behaviors, respectively.

Examples of semiconductor materials that can be used to implement the CMOS inverter include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a perspective view of a complementary metal oxide semiconductor (CMOS) structure incorporating a phase change memory (PCM) and a resistive random access memory (RRAM) in a crossbar array format, in accordance with an embodiment of the present invention.

A crossbar array 10 incorporates memory cells between a plurality of bit lines 14 (BL) and a plurality of word lines 12 (WL). Thus, the crossbar or crosspoint array 10 is obtained by perpendicular conductive wordlines (rows) 12 and bitlines (columns) 14, where a resistive processing unit 50 exists at the intersection between each row and column. The resistive processing unit 50 can be accessed for read and write by biasing the corresponding wordline 12 and bitline 14.

The resistive processing unit 50 includes a resistive random access memory (RRAM) 20, a phase change memory (PCM) 30, a complementary metal oxide semiconductor (CMOS) inverter including an n-type metal oxide semiconductor (NMOS) circuit 40 and a p-type metal oxide semiconductor (PMOS) circuit 44. The resistive processing unit (RPU) 50 represents a memory cell incorporated between the wordlines 12 and the bitlines 14.

The RRAM 20 is connected in series to the PCM 30. The CMOS inverter 40, 44 is connected in parallel to the RRAM 20 and the PCM 30. The NMOS circuit 40 is connected in parallel to the PCM 30 and the PMOS circuit 44 is connected in parallel to the RRAM 20.

The RRAM 20 includes a bottom electrode 22, an insulating layer 24, and a top electrode 26. The top electrode 26 can be referred to as a reactive electrode. It is contemplated that the reactive electrode can be physically positioned or located at a bottom portion of certain RRAM products. The bottom electrode 22 can be referred to as an inert electrode.

It is contemplated that the inert electrode can be physically positioned or located at a top portion of certain RRAM products.

The top and bottom electrodes 26, 22 can be, e.g., formed from Ta, Ti/TiN, W, TaN, Ti, TiN, W, Mo, or any other suitable material, or any other conductive material, and can be deposited or formed in any suitable manner.

The PCM 30 includes a bottom electrode 32, a phase change material layer 34, and a top electrode 36.

The top and bottom electrodes 36, 32 can be, e.g., formed from Ta, Ti/TiN, W, TaN, or any other suitable material, or any other conductive material, and can be deposited or formed in any suitable manner.

The reactive electrode 26 of the RRAM 20 is connected to the top electrode 36 of the PCM 30. The inert electrode 22 of the RRAM 20 is connected to the BL 14. The bottom electrode 32 of the PCM 30 is connected to ground.

The phase change material 34 can include chalcogenide based materials and other materials. Chalcogens include any of the four elements oxygen (O), sulfur (S), selenium (Se), and tellurium (Te), forming part of group VI of the periodic table. Chalcogenides include compounds of a chalcogen with a more electropositive element or radical. Chalcogenide alloys include combinations of chalcogenides with other materials such as transition metals. A chalcogenide alloy usually includes one or more elements from column six of the periodic table of elements, such as germanium (Ge) and tin (Sn). Often, chalcogenide alloys include combinations including one or more of antimony (Sb), gallium (Ga), indium (In), and silver (Ag). Phase change based memory materials can include alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. Examples of commonly used phase change materials are: GeTe, $Ge_2Sb_2Te_5$, and $Sb_2Te$.

Chalcogenides and other phase change materials are doped with impurities in some embodiments to modify conductivity, transition temperature, melting temperature, and other properties of memory elements using the doped chalcogenides. Representative impurities employed for doping chalcogenides include nitrogen, silicon, oxygen, silicon dioxide, silicon nitride, and carbon.

Figure 2:
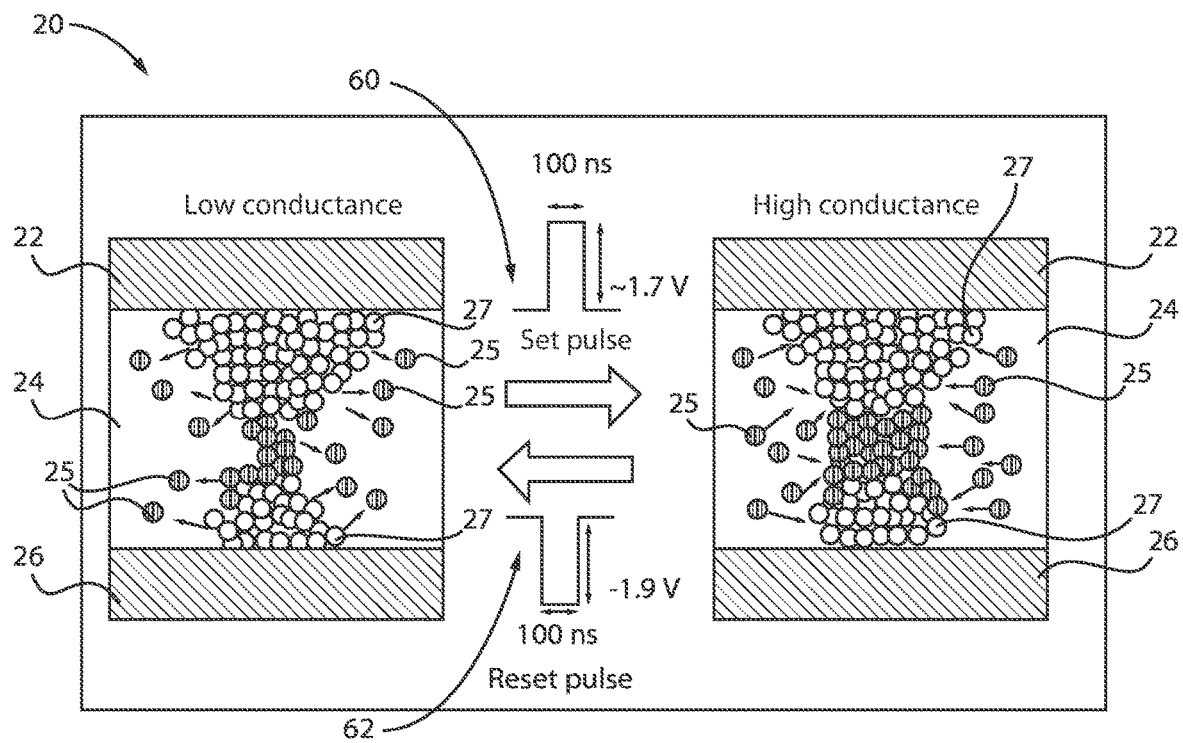
FIG. 2 is a schematic of the switching mechanism of the RRAM device of FIG. 1, in accordance with an embodiment of the present invention.

FIG. 2 is a schematic of the switching mechanism of the RRAM device of FIG. 1, in accordance with an embodiment of the present invention.

In a low conductance state or a high-resistance state (left-hand side), a movement of the oxygen vacancies 25, 27 is shown. The movement of the oxygen vacancies 25, 27 is of a probabilistic nature and has an inherent randomness.

In a high conductance state or low-resistance state (right-hand side), a different movement of the oxygen vacancies 25, 27 is shown relative to the low conductance state or a high-resistance state. The movement of the oxygen vacancies 25, 27 is of a probabilistic nature and has an inherent randomness.

In operation, in the OFF state, a ReRAM device 20 has a high electrical resistance (left-hand side). When a voltage is applied, the transportation of metal ions changes the metallic filament that is sandwiched between reactive electrode 26 and inert electrode 22, and therefore the resistance of the ReRAM device is modulated. In such case, the ReRAM device usually has a low resistance (ON state; right-hand side) or, stated differently, a low resistance path is created between the top and bottom electrodes (or reactive and inert electrodes).

By applying an external voltage across the ReRAM cell, the ReRAM cell can be switched between a high resistance state (HRS or OFF-state) and a low resistance state (LRS or ON-state), which are used to represent the logical "0" and "1", respectively. According to the polarity of the programming voltage, ReRAM cells can be classified into unipolar ReRAM and bipolar ReRAM. The resistance switching of a unipolar ReRAM only depends on the magnitude of programming voltage, whereas in bipolar ReRAM, HRS-to-LRS switching (SET operation) and LRS-to-HRS switching (RESET operation) need programming voltages with opposite polarities. Compared to unipolar ReRAM, bipolar ReRAM is more attractive because of its good cell characteristics, better switching uniformity, and operating margin. The SET pulse 60 can have a width of approximately 100 ns and can be a voltage of, e.g., 1.7V. The RESET pulse 62 can have a width of approximately 100 ns and can be a voltage of, e.g., 1.9V.

Figure 3:
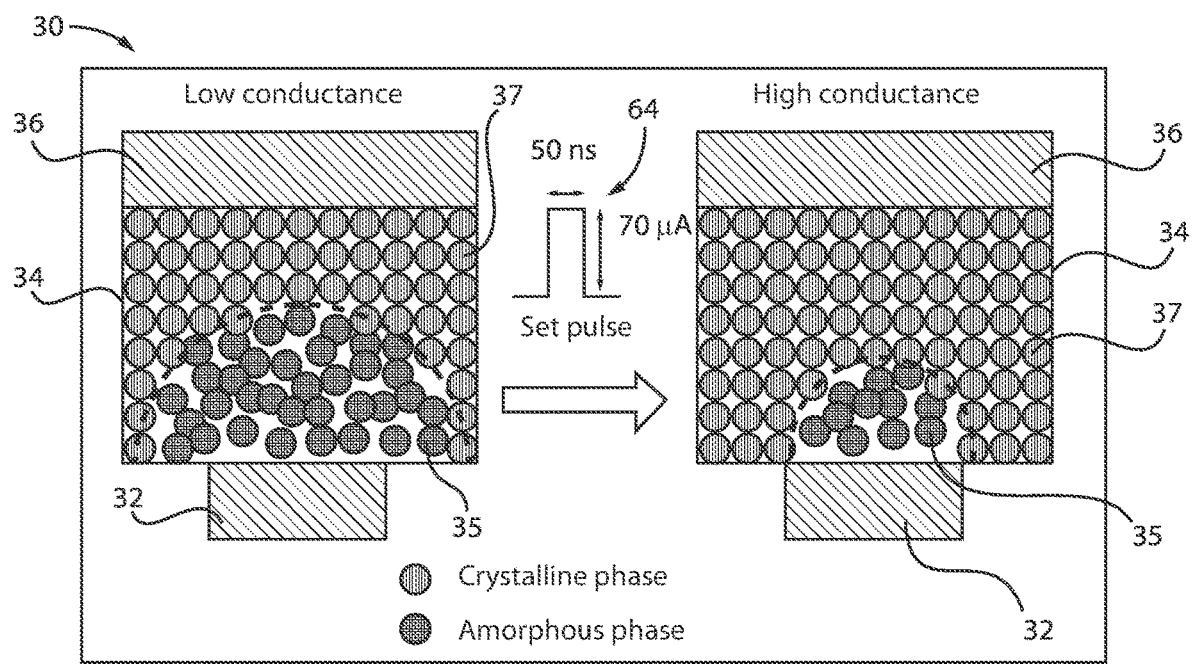
FIG. 3 is a schematic of the switching mechanism of the PCM device of FIG. 1, in accordance with an embodiment of the present invention.

FIG. 3 is a schematic of the switching mechanism of the PCM device of FIG. 1, in accordance with an embodiment of the present invention.

In a low conductance state or a high-resistance state (left-hand side), the ordering or arrangements of the two phases, amorphous 35 and crystalline 37 is shown.

In a high conductance state or low-resistance state (right-hand side), the amorphous region 35 volume is substantially reduced, while the crystalline region 37 now occupies a larger region. In fact, the material between the two electrodes 32 and 36 can be fully crystallized with amorphous region 35 being absent.

Transition from the low conductance state (amorphous phase) to the high conductance state (crystalline phase) is caused by SET pulses that create sufficient joule heating for crystallization of the phase change material while the temperature is kept below the melting point. On the other hand, RESET to the low conductance state needs melting of the phase change material and this process is known to be abrupt to prevent the material from crystallizing during cooling. The SET pulse 64 can have a width of approximately 50 ns.

Phase change material 34 can be changed from one phase state to another by application of electrical pulses. A shorter, higher amplitude pulse tends to change the phase change material 34 to a generally amorphous state, and is referred to as a RESET pulse. A longer, lower amplitude pulse tends to change the phase change material to a generally crystalline state, and is referred to as a program pulse or SET pulse. The energy in a shorter, higher amplitude pulse is high enough to melt the material adjacent to the bottom electrode 32, and short enough to allow the material to solidify in the amorphous state. This process is also known as "melt-quench."

Phase change materials, such as chalcogenides, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials are capable of being switched between a first structural state in which the material is in a generally amorphous solid phase, and a second structural state in which the material is in a generally crystalline solid phase in the active region of the cell. The term "amorphous" is used to refer to a relatively less ordered structure, more disordered than a single crystal, which has the detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material can be switched into either different solid phases or mixtures of two or more solid phases, providing a gray scale between completely amorphous and completely crystalline states.

The change from the amorphous to the crystalline state is generally a lower current operation, needing a current that is sufficient to raise the phase change material to a level between a phase transition temperature and a melting temperature. It is desirable to minimize the magnitude of the reset current used to cause transition of phase change material from a crystalline state to an amorphous state. The magnitude of the needed reset current can be reduced by making the bottom electrode contact area smaller, and by making the crystalline phase change material more resistive, for example, by adding a dopant such as nitrogen or $SiO_2$.

Figure 4:
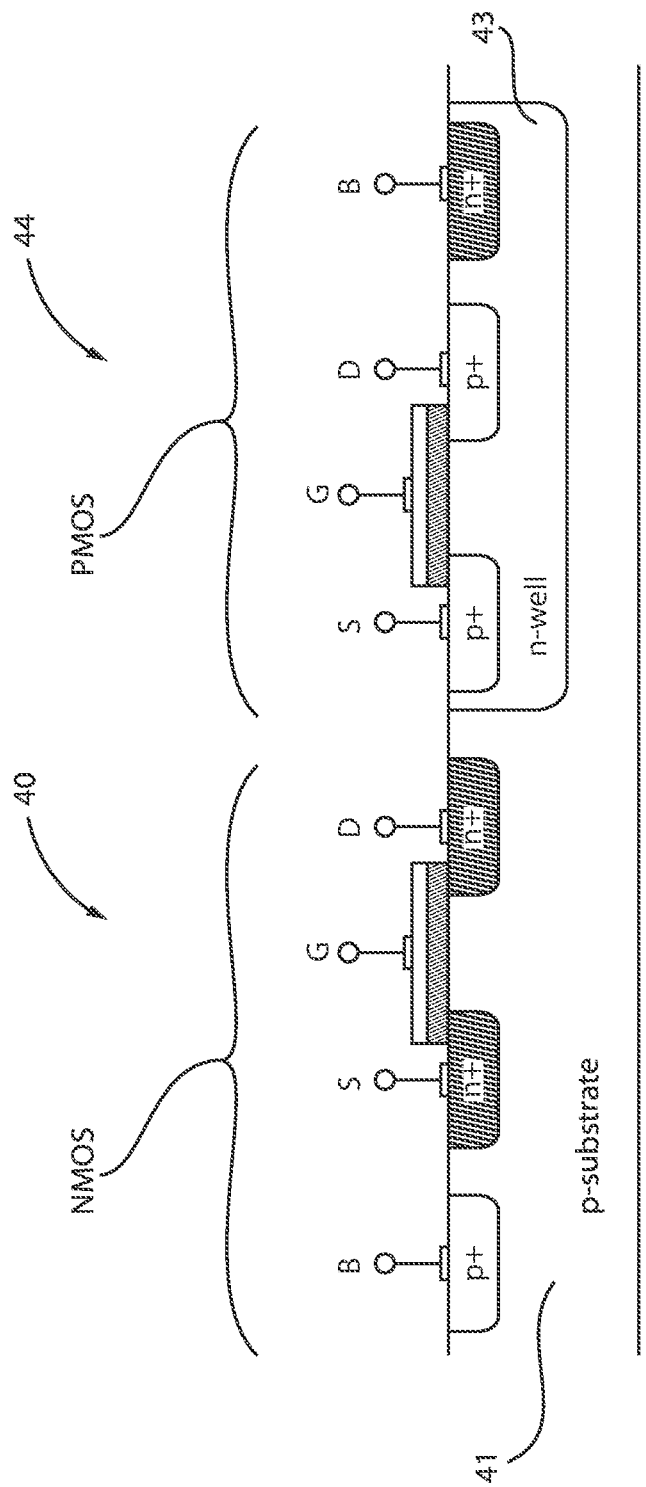
FIG. 4 is a cross-sectional view of two transistors in a CMOS gate, in an n-well CMOS process, in accordance with an embodiment of the present invention.

FIG. 4 is a cross-sectional view of two transistors in a CMOS gate, in an n-well CMOS process, in accordance with an embodiment of the present invention.

The CMOS gate includes an NMOS circuit 40 on a p-substrate 41 and a PMOS circuit 44 on an n-well 43. The NMOS circuit 40 is connected to the PCM 30 and the PMOS circuit 44 is connected to the RRAM 20. It is noted that while FIG. 4 illustrates a PMOS and NMOS built using planar transistor technology, the NMOS and PMOS devices are likely to be implemented using FinFET technology or gate-all-around FETs.

The CMOS is constructed in such a way that all PMOS transistors must have either an input from the voltage source or from another PMOS transistor. Similarly, all NMOS transistors must have either an input from ground or from another NMOS transistor. The composition of a PMOS transistor creates low resistance between its source (S) and drain (D) contacts when a low gate voltage is applied and high resistance when a high gate voltage is applied. On the other hand, the composition of an NMOS transistor creates high resistance between source (S) and drain (D) when a low gate voltage is applied and low resistance when a high gate voltage is applied. CMOS accomplishes current reduction by complementing every nMOSFET with a pMOSFET and connecting both gates (G) and both drains together. A high voltage on the gates (G) will cause the nMOSFET to conduct and the pMOSFET not to conduct, while a low voltage on the gates causes the reverse.

Figure 5:
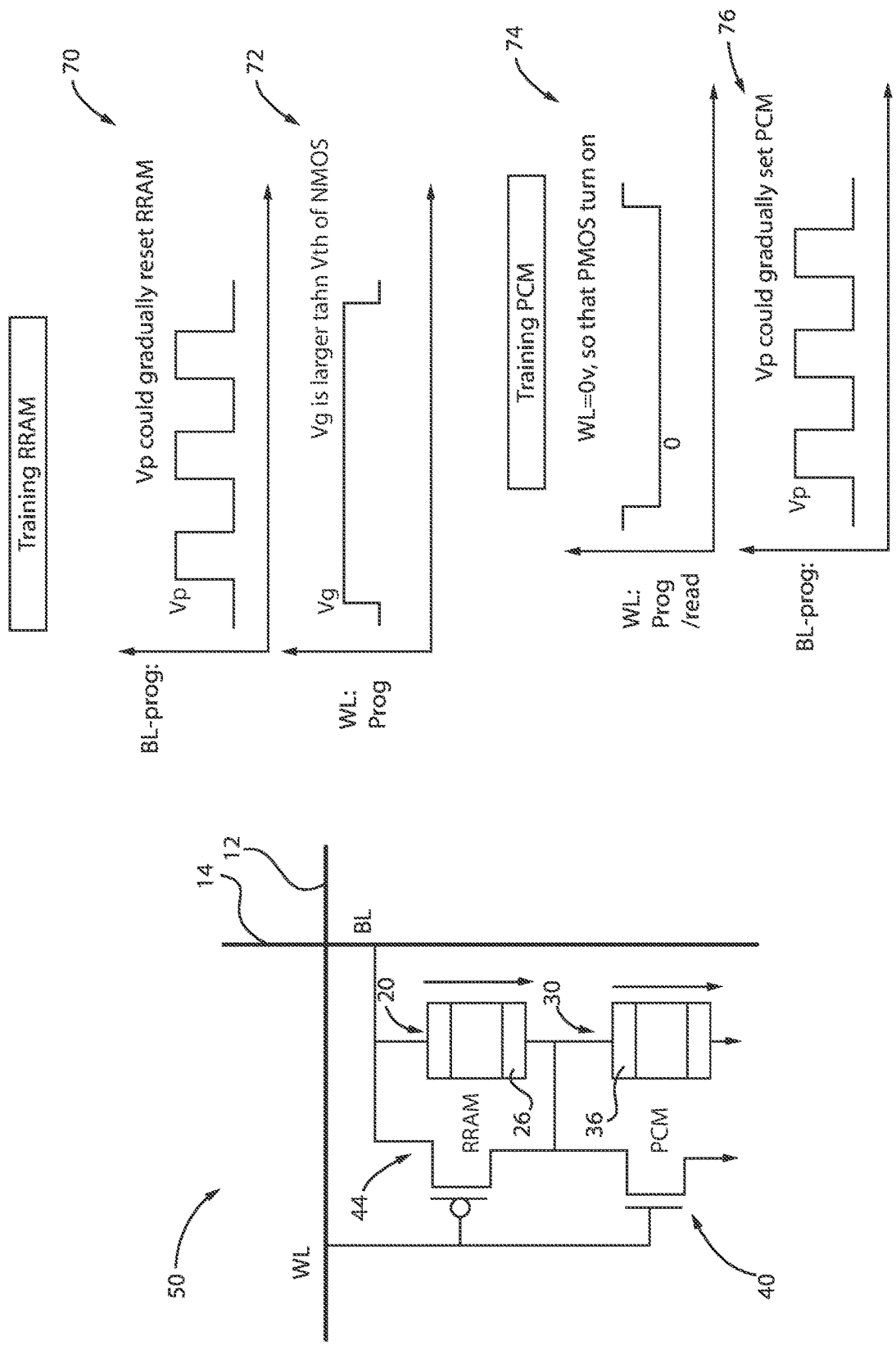
FIG. 5 is a schematic depicting training or programming of the RRAM device and the PCM device, in accordance with an embodiment of the present invention.

FIG. 5 is a schematic depicting training or programming of the RRAM and PCM devices, in accordance with an embodiment of the present invention.

The PCM device can be set gradually but shows abrupt RESET. This means that the conductance of the PCM device can be increased gradually, but a gradual decease of the conductance is difficult to achieve. The RRAM device suffers from abrupt SET but can be reset gradually. To set the PCM device, a positive pulse is applied to the NMOS circuit, and to reset the RRAM, a negative pulse is applied to the PMOS circuit. The NMOS circuit needs a positive bias on the gate to turn on the channel, and it turns off when the gate bias is negative, whereas the PMOS circuit needs a negative bias to turn on and will turn off when the gate bias is positive. The exemplary embodiments of the present invention thus employ an NMOS and a PMOS circuit pair that controls if the PCM device or the RRAM device will be selected for programming during SET or RESET operations or behaviors.

The resistive processing unit 50, which is a CMOS inverter with PCM and RRAM structure (or crossbar element) improves linearity and avoids abrupt SET/RESET behaviors in weight updates. The total weight is stored by the total resistance of the RRAM and the PCM, which are connected in series, and the weight is updated by programming the RRAM (RESET) and the PCM (SET) individually. In principle, resistive processing unit 50 provides flexibility and utilizes the advantages of the PCM and RRAM devices, and further avoids the drawbacks of such devices (e.g., abrupt change in behavior.) The resistive processing unit 50 has several benefits and could significantly enhance linearity and improve neural network training accuracy.

When training the RRAM 20, the gate voltage (Vg) is larger than the threshold voltage (Vth) of the NMOS circuit 40, so the NMOS circuit 40 turns on, and the top electrodes 36, 26 of the PCM 30 and the RRAM 20, respectively, are 0. As such, the NMOS is shorting the PCM device 30, so the programming current passes only through the RRAM device 20. The pulse for the bitline programming is designated as 70, whereas the pulse for the wordline programming is designated as 72.

When training the PCM 30, the wordline 12 is set to 0V (and the amplitude of the bitline 14 is large enough so that the |Vgs| of the PMOS circuit 44 is larger than the threshold voltage (Vth) of the PMOS circuit 44), the PMOS circuit 44 is turned on, and the top electrode 36 of PCM 30 and the RRAM 20 is equal to the bitline voltage. The pulse for the wordline programming is designated as 74, whereas the pulse for the bitline programming is designated as 76. In this case, the RRAM device is shorted by the PMOS device and the programming current is passed only through the PCM device 30.

Figure 6:
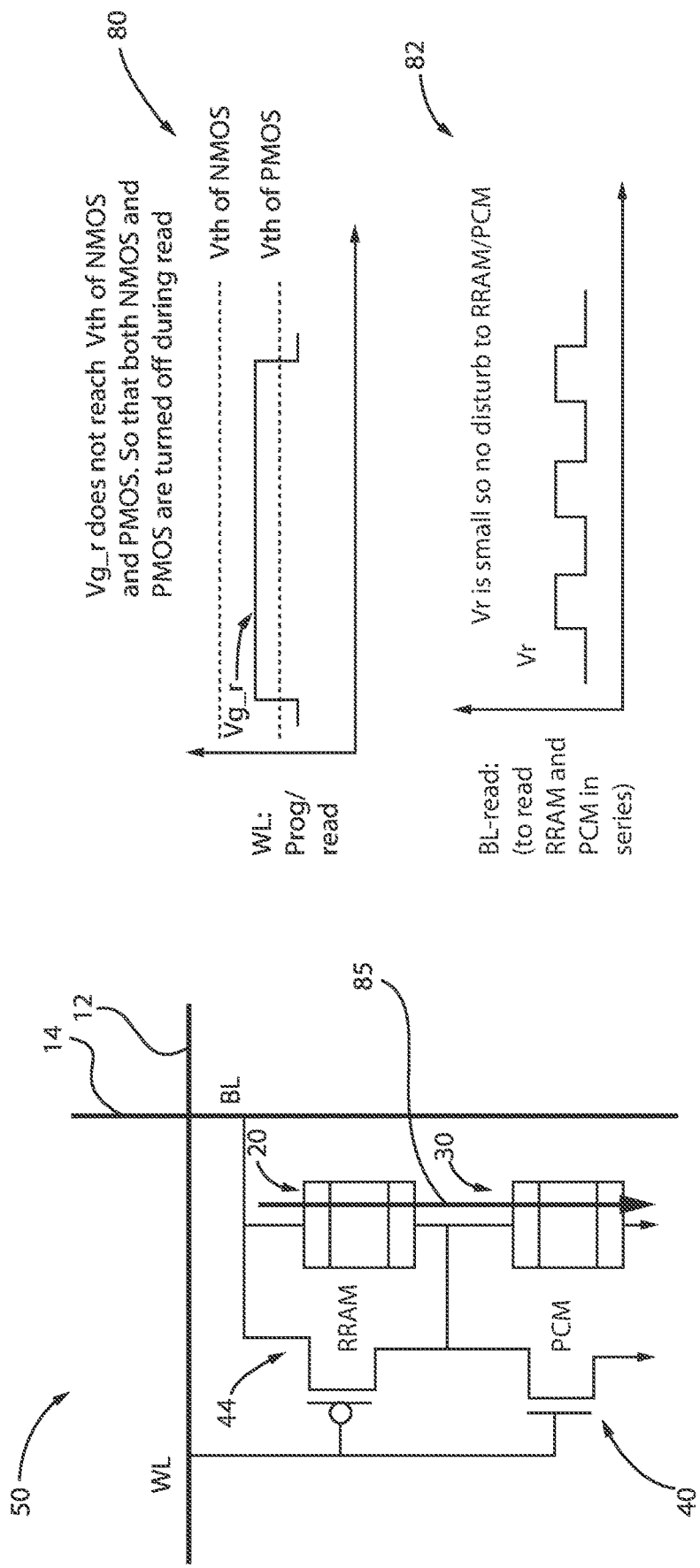
FIG. 6 is a schematic depicting reading of the RRAM and PCM devices, in accordance with an embodiment of the present invention.

FIG. 6 is a schematic depicting reading of the RRAM and PCM, in accordance with an embodiment of the present invention.

During read operation 85 of the RRAM 20 and the PCM 30, the wordline voltage is smaller than the Vth of the NMOS circuit 40, so that the NMOS circuit 40 is turned off. Meanwhile, the wordline voltage is also larger than 0, so that the PMOS circuit 44 is still turned off. With such wordline voltage, both the NMOS circuit 40 and PMOS circuit 44 are turned off, then RRAM 20 and PCM 30 are connected in series, and the combined read resistance represents the weight. The pulse for the wordline programming is designated as 80, whereas the pulse for the bitline programming is designated as 82.

Figure 7:
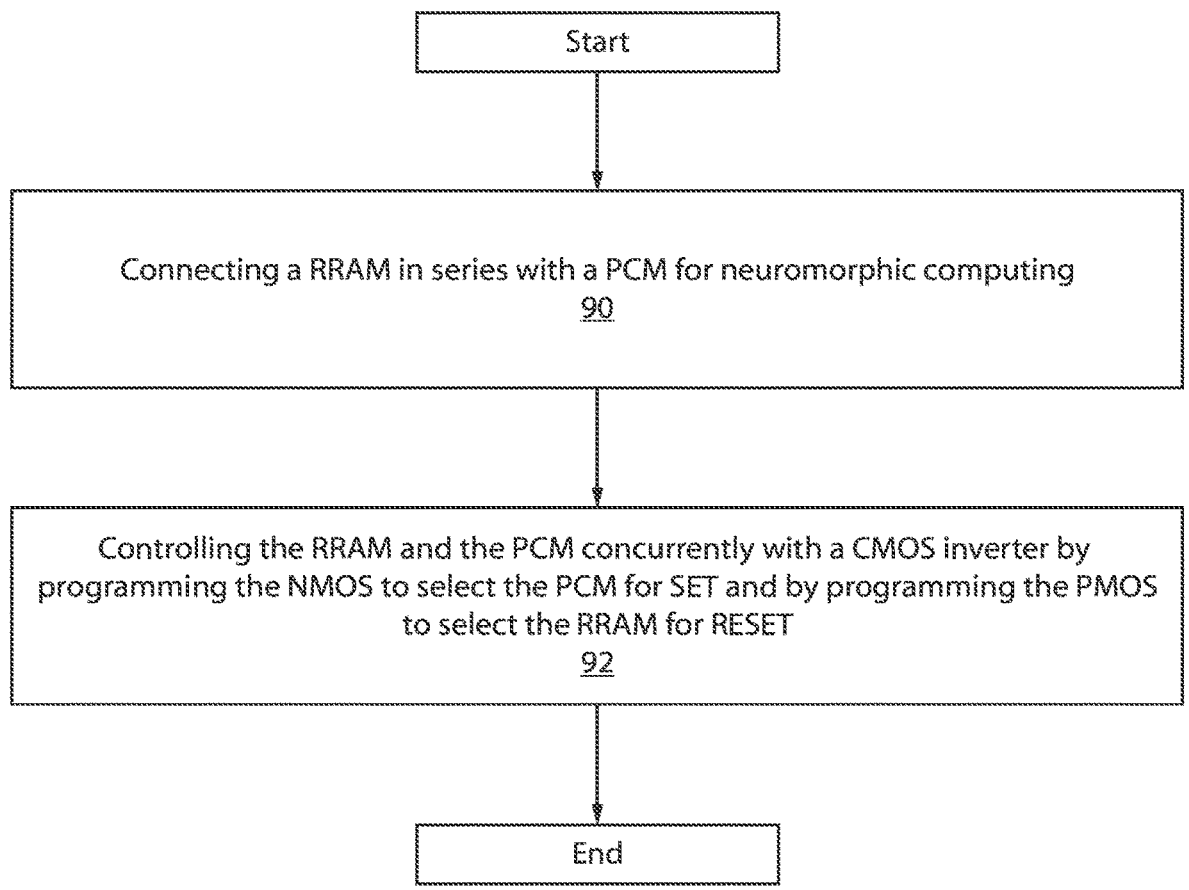
FIG. 7 is a block/flow diagram of an exemplary method for employing a CMOS inverter to avoid abrupt set of RRAM and abrupt reset of PCM, in accordance with an embodiment of the present invention.

FIG. 7 is a block/flow diagram of an exemplary method for employing a CMOS inverter to avoid abrupt set of RRAM and abrupt reset of PCM, in accordance with an embodiment of the present invention.

At block 90, connect a RRAM in series with a PCM for neuromorphic computing.

At block 92, concurrently control the RRAM and the PCM with a CMOS inverter by programming the NMOS to select the PCM for SET and by programming the PMOS to select the RRAM for RESET. Individual selections can be made of either the RRAM or the PCM.

Figure 8:
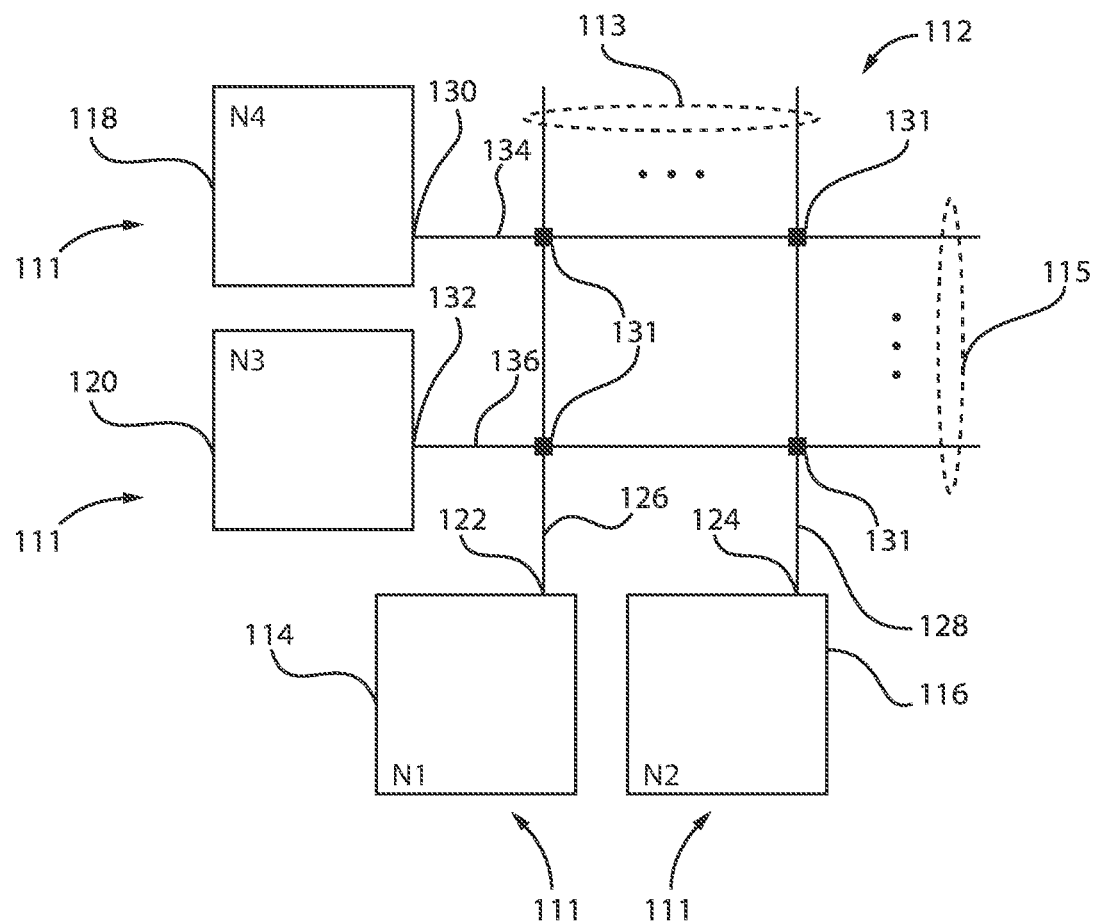
FIG. 8 is a block/flow diagram of an exemplary neuromorphic and synaptronic network including a crossbar of electronic synapses interconnecting electronic neurons and axons, in accordance with an embodiment of the present invention.

FIG. 8 is a block/flow diagram of an exemplary neuromorphic and synaptronic network including a crossbar of electronic synapses interconnecting electronic neurons and axons, in accordance with an embodiment of the present invention.

The example tile circuit 100 has a crossbar 112 in accordance with an embodiment of the invention. In one example, the overall circuit can include an "ultra-dense crossbar array" that can have a pitch in the range of about 1 nm to 10 μm. The neuromorphic and synaptronic circuit 100 includes the crossbar 112 interconnecting a plurality of digital neurons 111 including neurons 114, 116, 118 and 120. These neurons 111 are also referred to herein as "electronic neurons." For illustration purposes, the example circuit 100 provides symmetric connections between the two pairs of neurons (e.g., N1 and N3). However, embodiments of the invention are not only useful with such symmetric connection of neurons, but also useful with asymmetric connection of neurons (neurons N1 and N3 need not be connected with the same connection). The cross-bar in a tile accommodates the appropriate ratio of synapses to neurons, and, hence, need not be square.

In the example circuit 100, the neurons 111 are connected to the crossbar 112 via dendrite paths/wires (dendrites) 113 such as dendrites 126 and 128. Neurons 111 are also connected to the crossbar 112 via axon paths/wires (axons) 115 such as axons 134 and 136. Neurons 114 and 116 are dendritic neurons and neurons 118 and 120 are axonal neurons connected with axons 113. Specifically, neurons 114 and 116 are shown with outputs 122 and 124 connected to dendrites (e.g., bitlines) 126 and 128, respectively. Axonal neurons 118 and 120 are shown with outputs 130 and 132 connected to axons (e.g., wordlines or access lines) 134 and 136, respectively.

When any of the neurons 114, 116, 118 and 120 fire, they will send a pulse out to their axonal and to their dendritic connections. Each synapse provides contact between an axon of a neuron and a dendrite on another neuron and with respect to the synapse, the two neurons are respectively called pre-synaptic and post-synaptic.

Each connection between dendrites 126, 128 and axons 134, 136 are made through a digital synapse device 131 (synapse). The junctions where the synapse devices are located can be referred to herein as "cross-point junctions." In general, in accordance with an embodiment of the invention, neurons 114 and 116 will "fire" (transmit a pulse) in response to the inputs they receive from axonal input connections (not shown) exceeding a threshold.

Neurons 118 and 120 will "fire" (transmit a pulse) in response to the inputs they receive from external input connections (not shown), usually from other neurons, exceeding a threshold. In one embodiment, when neurons 114 and 116 fire they maintain a postsynaptic-STDP (post-STDP) variable that decays. For example, in one embodiment, the decay period can be 50 ms. The post-STDP variable is used to achieve STDP by encoding the time since the last firing of the associated neuron. Such STDP is used to control long-term potentiation or "potentiation," which in this context is defined as increasing synaptic conductance. When neurons 118, 120 fire they maintain a pre-STDP (presynaptic-STDP) variable that decays in a similar fashion as that of neurons 114 and 116.

Pre-STDP and post-STDP variables can decay according to exponential, linear, polynomial, or quadratic functions, for example. In another embodiment of the invention, the variables can increase instead of decreasing over time. In any event, this variable can be used to achieve STDP by encoding the time since the last firing of the associated neuron. STDP is used to control long-term depression or "depression," which in this context is defined as decreasing synaptic conductance. Note that the roles of pre-STDP and post-STDP variables can be reversed with pre-STDP implementing potentiation and post-STDP implementing depression.

An external two-way communication environment can supply sensory inputs and consume motor outputs. Digital neurons 111 implemented using complementary metal oxide semiconductor (CMOS) logic gates receive spike inputs and integrate them. In one embodiment, the neurons 111 include comparator circuits that generate spikes when the integrated input exceeds a threshold. In one embodiment, binary synapses are implemented using transposable 1-bit static random-access memory (SRAM) cells, wherein each neuron 111 can be an excitatory or inhibitory neuron (or both). Each learning rule on each neuron axon and dendrite are reconfigurable as described below. This assumes a transposable access to the crossbar memory array. Neurons that spike are selected one at a time sending spike events to corresponding axons, where axons could reside on the core or somewhere else in a larger system with many cores.

The term electronic neuron as used herein represents an architecture configured to simulate a biological neuron. An electronic neuron creates connections between processing elements that are roughly functionally equivalent to neurons of a biological brain. As such, a neuromorphic and synaptronic system including electronic neurons according to embodiments of the invention can include various electronic circuits that are modeled on biological neurons. Further, a neuromorphic and synaptronic system including electronic neurons according to embodiments of the invention can include various processing elements (including computer simulations) that are modeled on biological neurons. Although certain illustrative embodiments of the invention are described herein using electronic neurons including electronic circuits, the present invention is not limited to electronic circuits. A neuromorphic and synaptronic system according to embodiments of the invention can be implemented as a neuromorphic and synaptronic architecture including circuitry, and additionally as a computer simulation. Indeed, embodiments of the invention can take the form of an entirely hardware embodiment, an entirely software embodiment, or an embodiment including both hardware and software elements.

Figure 9:
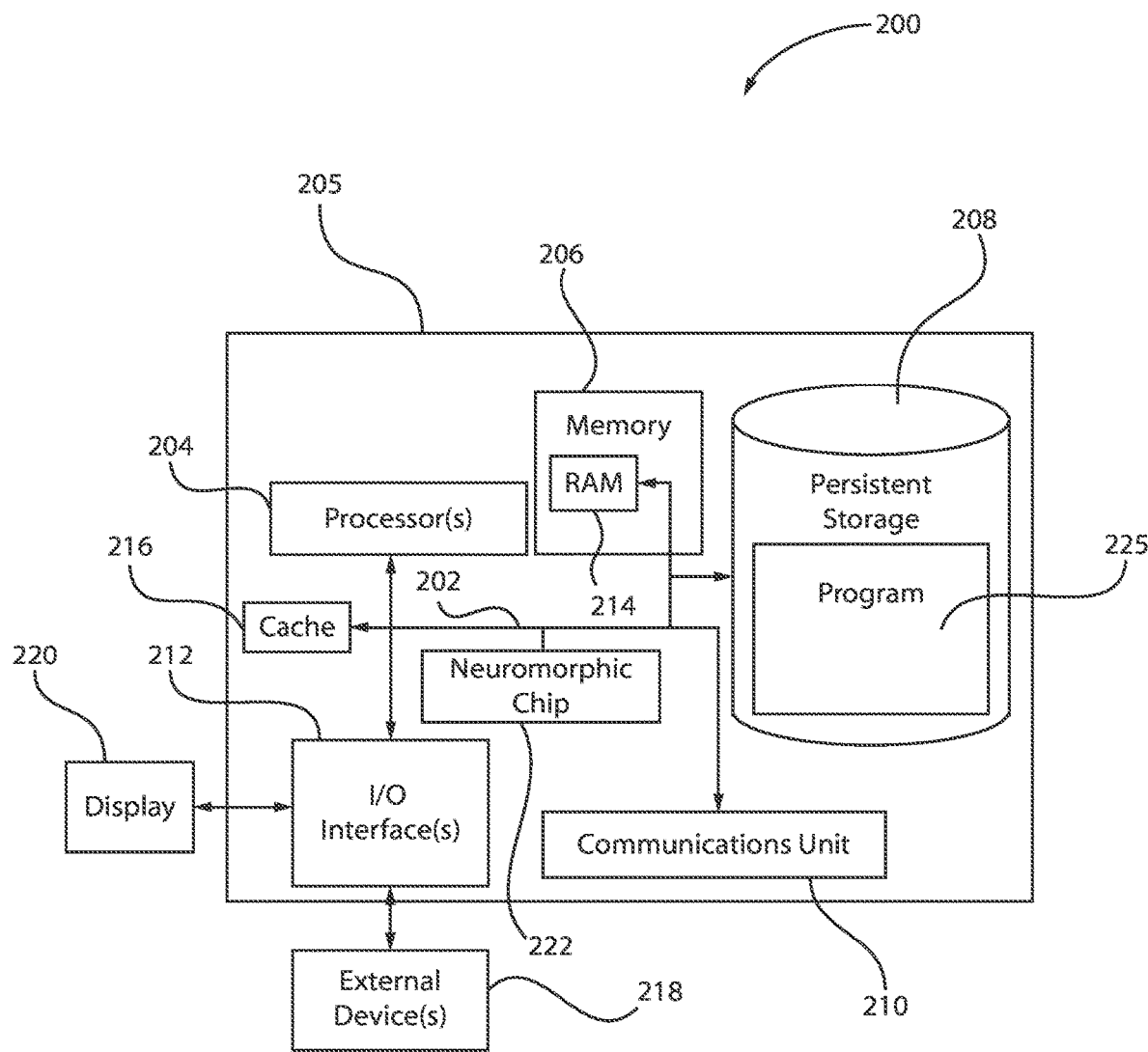
FIG. 9 depicts a block diagram of components of a computing system including a computing device and a neuromorphic chip capable of operationally performing deep learning sampling, in accordance with an embodiment of the present invention.

FIG. 9 depicts a block diagram of components of a computing system including a computing device and a neuromorphic chip capable of operationally performing deep learning sampling, in accordance with an embodiment of the present invention.

FIG. 9 depicts a block diagram of components of system 200, which includes computing device 205. It should be appreciated that FIG. 9 provides only an illustration of one implementation and does not imply any limitations with regard to the environments in which different embodiments can be implemented. Many modifications to the depicted environment can be made.

Computing device 205 includes communications fabric 202, which provides communications between computer processor(s) 204, memory 206, persistent storage 208, communications unit 210, and input/output (I/O) interface(s) 212. Communications fabric 202 can be implemented with any architecture designed for passing data and/or control information between processors (such as microprocessors, communications and network processors, etc.), system memory, peripheral devices, and any other hardware components within a system. For example, communications fabric 202 can be implemented with one or more buses.

Memory 206, cache memory 216, and persistent storage 208 are computer readable storage media. In this embodiment, memory 206 includes random access memory (RAM) 214. In general, memory 206 can include any suitable volatile or non-volatile computer readable storage media.

In some embodiments of the present invention, deep learning program 225 is included and operated by neuromorphic chip 222 as a component of computing device 205. In other embodiments, deep learning program 225 is stored in persistent storage 208 for execution by neuromorphic chip 222 in conjunction with one or more of the respective computer processors 204 via one or more memories of memory 206. In this embodiment, persistent storage 208 includes a magnetic hard disk drive. Alternatively, or in addition to a magnetic hard disk drive, persistent storage 208 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 208 can also be removable. For example, a removable hard drive can be used for persistent storage 208. Other examples include optical and magnetic disks, thumb drives, and smart cards that are inserted into a drive for transfer onto another computer readable storage medium that is also part of persistent storage 208.

In some embodiments of the present invention, neuromorphic chip 222 is included in computing device 205 and connected to communications fabric 202. Neuromorphic chip 222 includes electronic logic to provide stacked restricted Boltzmann machines, and a feed forward neural network, including deep learning algorithmic components that are trainable and perform machine learning. In other embodiments, the logistical and algorithmic components operations are performed by specialized data structures, included within computing device 205, which perform the deep learning functions of the stacked restricted Boltzmann machines, and feed forward neural network.

Communications unit 210, in these examples, provides for communications with other data processing systems or devices, including resources of distributed data processing environment. In these examples, communications unit 210 includes one or more network interface cards. Communications unit 210 can provide communications through the use of either or both physical and wireless communications links. Deep learning program 225 can be downloaded to persistent storage 208 through communications unit 210.

I/O interface(s) 212 allows for input and output of data with other devices that can be connected to computing system 200. For example, I/O interface 212 can provide a connection to external devices 218 such as a keyboard, keypad, a touch screen, and/or some other suitable input device. External devices 218 can also include portable computer readable storage media such as, for example, thumb drives, portable optical or magnetic disks, and memory cards.

Display 220 provides a mechanism to display data to a user and can be, for example, a computer monitor.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method and device for employing a CMOS inverter with a RRAM and a PCM in a cell structure to avoid abrupt SET of the RRAM and abrupt RESET of the PCM (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a cell structure, the method comprising:
    constructing a resistive random access memory (RRAM) device;
    constructing a phase change memory (PCM) device in series with the RRAM device such that one of the electrodes of the PCM device is connected to a reactive electrode of the RRAM device; and
    connecting a complementary metal oxide semiconductor (CMOS) inverter to the RRAM and PCM devices to individually control switching behaviors of the RRAM and PCM devices.

2. The method of claim 1, wherein the CMOS inverter selects the RRAM device for RESET operations.

3. The method of claim 1, wherein the CMOS inverter selects the PCM device for SET operations.

4. The method of claim 1, wherein one of the electrodes of the PCM device is connected to ground and an inert electrode of the RRAM device is connected to a bitline.

5. The method of claim 1, wherein a p-type metal oxide semiconductor (PMOS) device of the CMOS inverter is connected in parallel to the RRAM device and wherein an n-type metal oxide semiconductor (NMOS) device of the CMOS inverter is connected in parallel to the PCM device.

6. The method of claim 1, wherein an n-type metal oxide semiconductor (NMOS) circuit of the CMOS inverter disables programming of the PCM device and a p-type metal oxide semiconductor (PMOS) circuit of the CMOS inverter disables programming of the RRAM device.

7. The method of claim 1, wherein an n-type metal oxide semiconductor (NMOS) circuit of the CMOS inverter selects the RRAM device for programming and a p-type metal oxide semiconductor (PMOS) circuit of the CMOS inverter selects the RRAM device for programming.

8. A cell structure for improving linearity of analog memory elements for neuromorphic computing, the cell structure comprising:
    a resistive random access memory (RRAM) device;
    a phase change memory (PCM) device connected in series with the RRAM device such that one of the electrodes of the PCM device is connected to a reactive electrode of the RRAM device; and
    a complementary metal oxide semiconductor (CMOS) inverter connected to the RRAM and PCM devices to individually control switching behaviors of the RRAM and PCM devices.

9. The cell structure of claim 8, wherein the CMOS inverter selects the RRAM device for RESET operations.

10. The cell structure of claim 8, wherein the CMOS inverter selects the PCM device for SET operations.

11. The cell structure of claim 8, wherein one of the electrodes of the PCM device is connected to ground and an inert electrode of the RRAM device is connected to a bitline.

12. The cell structure of claim 8, wherein a p-type metal oxide semiconductor (PMOS) device of the CMOS inverter is connected in parallel to the RRAM device and wherein an n-type metal oxide semiconductor (NMOS) device of the CMOS inverter is connected in parallel to the PCM device.

13. The cell structure of claim 8, wherein an n-type metal oxide semiconductor (NMOS) circuit of the CMOS inverter disables programming of the PCM device and a p-type metal oxide semiconductor (PMOS) circuit of the CMOS inverter disables programming of the RRAM device.

14. The cell structure of claim 8, wherein an n-type metal oxide semiconductor (NMOS) circuit of the CMOS inverter selects the RRAM device for programming and a p-type metal oxide semiconductor (PMOS) circuit of the CMOS inverter selects the RRAM device for programming.

15. A crossbar array including a plurality of crossbar elements for improving linearity for neuromorphic computing, the crossbar array comprising:
 a plurality of bitlines and wordlines; and
 the plurality of crossbar elements, each crossbar element disposed between a bitline and a wordline, wherein each crossbar element includes:
 a resistive random access memory (RRAM) device;
 a phase change memory (PCM) device connected in series with the RRAM device such that one of the electrodes of the PCM device is connected to a reactive electrode of the RRAM device; and
 a complementary metal oxide semiconductor (CMOS) inverter connected to the RRAM and PCM devices to individually control switching behaviors of the RRAM and PCM devices.

16. The crossbar array of claim 15, wherein the CMOS inverter selects the RRAM device for RESET operations.

17. The crossbar array of claim 15, wherein the CMOS inverter selects the PCM device for SET operations.

18. The crossbar array of claim 15, wherein one of the electrodes of the PCM device is connected to ground.

19. The crossbar array of claim 15, wherein an inert electrode of the RRAM device is connected to the bitline.

20. The crossbar array of claim 15, wherein a p-type metal oxide semiconductor (PMOS) device of the CMOS inverter is connected in parallel to the RRAM device and wherein an n-type metal oxide semiconductor (NMOS) device of the CMOS inverter is connected in parallel to the PCM device.

* * * * *